United States Patent [19]

Agarwala et al.

[11] Patent Number: 4,970,570

[45] Date of Patent: Nov. 13, 1990

[54] USE OF TAPERED HEAD PIN DESIGN TO IMPROVE THE STRESS DISTRIBUTION IN THE BRAZE JOINT

[75] Inventors: Birendra N. Agarwala; Paul H. Palmateer, both of Wappingers Falls; Da-Yuan Shih, Poughkeepsie, all of N.Y.

[73] Assignee: International Business Machines Corporation, Armonk, N.Y.

[21] Appl. No.: 423,613

[22] Filed: Oct. 16, 1989

Related U.S. Application Data

[63] Continuation of Ser. No. 236,312, Aug. 23, 1988, abandoned, which is a continuation of Ser. No. 924,081, Oct. 28, 1986, abandoned.

[51] Int. Cl.$^5$ .................... H01L 23/48; H01L 23/54
[52] U.S. Cl. ........................................ 357/68; 357/67; 357/69
[58] Field of Search .............................. 357/68, 67, 69

[56] References Cited

U.S. PATENT DOCUMENTS

| | | | |
|---|---|---|---|
| 3,449,642 | 6/1969 | Ortner et al. | 357/65 |
| 3,457,386 | 7/1969 | Costello | 357/65 |
| 3,522,487 | 8/1970 | Hessinger | 357/65 |
| 4,070,688 | 1/1978 | Wislocky | 357/68 |
| 4,418,857 | 12/1983 | Ainslie et al. | 228/124 |
| 4,518,112 | 5/1985 | Miller et al. | 228/124 |
| 4,634,041 | 1/1987 | Prasad et al. | |
| 4,672,739 | 6/1987 | Churchwell et al. | 357/65 |

FOREIGN PATENT DOCUMENTS

| | | | |
|---|---|---|---|
| 59-89427 | 5/1984 | Japan | 357/65 |
| 60-5546 | 1/1985 | Japan | |
| 61-123160 | 6/1986 | Japan | |

OTHER PUBLICATIONS

IBM TDB vol. 25, No. 6, Nov. 1982, p. 2928, "Stress Diffusing Base For Connector Pins", VanVechten and VanGutfeld.

"Improvement of Metallization For Alumina Substrates", Shara et al, IEEE Electronic Components Conference Proceedings, May 1982, p. 32.

*Primary Examiner*—Rolf Hille
*Assistant Examiner*—S. V. Clark
*Attorney, Agent, or Firm*—Aziz M. Ahsan

[57] ABSTRACT

The present invention teaches a structure for reducing the stresses created on a substrate and on the bonding surface at which a connector is attached. The connector has a tapered or beveled head thereby tapering the stress away from the edges of the bonding surface and therefore away from the high stress areas of the substrate, preventing cracking and delamination problems that might otherwise result. The tapered-head geometry also allows greater flexibility in manufacturing the connectors particularly when fabricating pins using a cold-heading process in that a quarter shank diameter:pin head diameter ratio can be obtained.

20 Claims, 4 Drawing Sheets

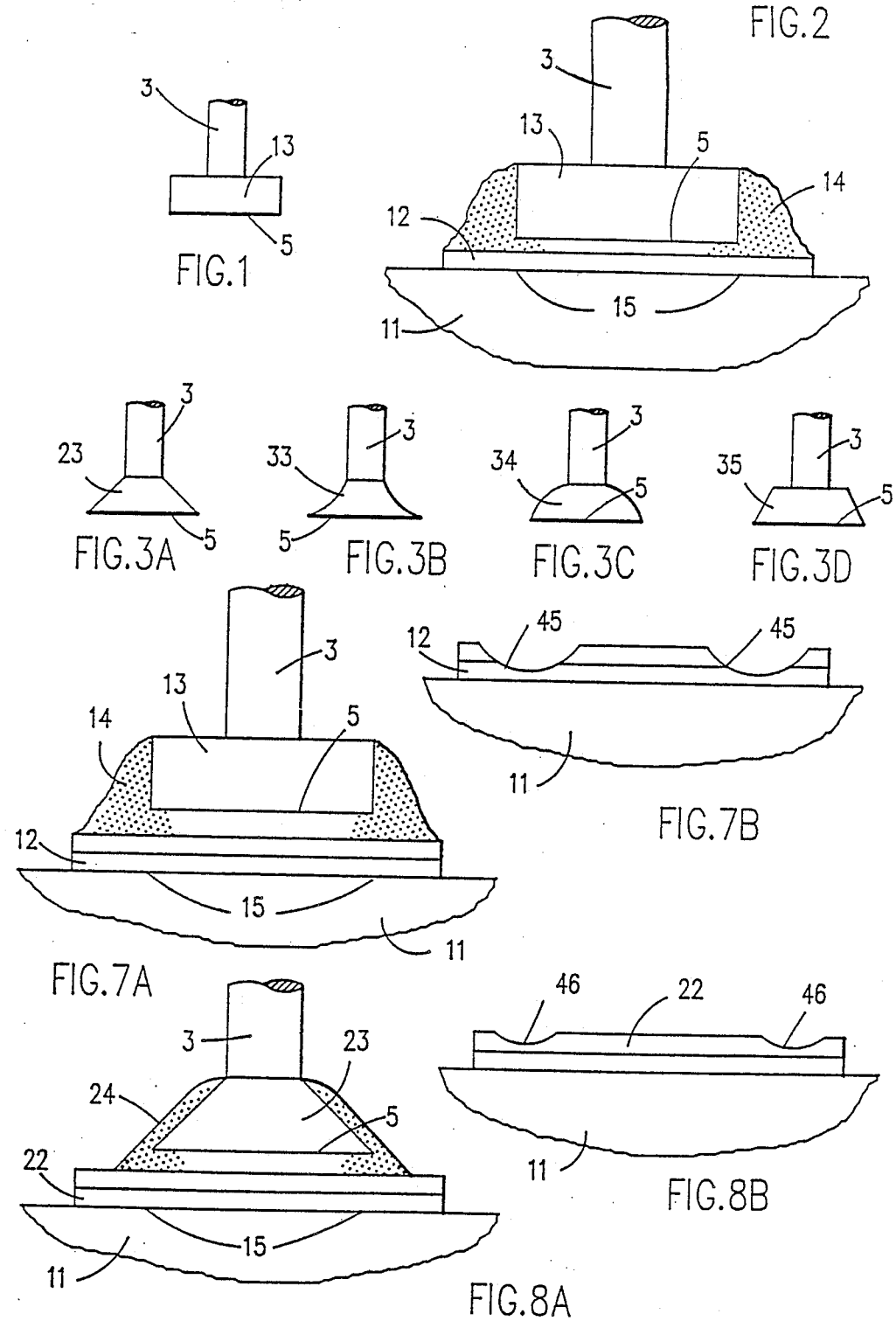

USE OF TAPERED HEAD PIN DESIGN TO IMPROVE THE STRESS DISTRIBUTION IN THE BRAZE JOINT

This Patent Application is a Continuation of U.S. patent application Ser. No. 07/236,312, filed Aug. 23, 1988 now abandoned, which was a Continuation of U.S. patent application Ser. No. 06/924,081, now abandoned.

FIELD OF THE INVENTION

The invention relates to the joining of connector pins to a metallic pad formed on a multilayer ceramic substrate. More particularly, a tapered head pin design is taught which relieves the stresses created at the pin:pad interface.

BACKGROUND OF THE INVENTION

In the field of semiconductor packaging, the use of multilayer ceramic (MLC) technology is widespread. In a typical package, the semiconductor chips are mounted on one surface of the multilayer ceramic substrate. The other surface of the substrate is provided with I/O pins or connectors for mounting or interconnection with the next level of packaging. Throughout the substrate a network of metallurgy is fabricated for interconnection from the pins to the integrated circuit devices that are mounted on the top surface. The I/O pins are ordinarily bonded, by a braze or solder process, to a bonding pad which is also the termination pad of the internal metallurgy system. The termination pads are formed in a conventional method, such as by screening the metal pastes through a mask prior to the sintering thereof, or by metallization such as, by electron beam evaporation, sputtering or other methods after sintering. The I/O pins are then bonded to the termination pads, usually by means of a Au-Sn braze. The bonding material must be sufficiently strong to withstand the environmental conditions met in operation; and, the braze alloy should also be such that is not significantly affected by the thermal and tensile stresses associated with the processing steps undertaken for completion of the package, such as the device mounting procedures. Since the multilayer ceramic substrates are designed to carry a large number of devices, there is ordinarily a need for several re-work steps to allow for device defects and engineering changes. The bonds between the I/O pins and the termination pads must therefore withstand many temperature cycles in the course of the processing and re-working stages. Beyond the fabrication considerations, tensile stresses are created in the vicinity of the I/O pads during usage and have been found to be dependent upon the size, thickness and geometry of the termination pads, the material properties of the pads, the pin joint morphology, and the distribution and material properties of the braze alloy. With this knowledge, various approaches to stress relief in the I/O pin region have been explored. With regard to the thermal stresses, a materials-related approach has been attempted in order to match the thermal expansion coefficients of the associated materials. For example, Kovar (a trademark of Westinghouse Electric Corporation) is commonly used as a pin material as it has a thermal expansion coefficient which is compatible with that of an alumina substrate. The braze and pad materials can be altered in order to provide intermediary TCE's between the substrate and the pin materials in order to reduce the thermal stresses, as taught in U.S. Pat. No. 4,418,857 to Ainslie, et al and U.S. Pat. No. 4,518,112 to Miller et al. In addition to the braze alloy material modification, the Ainslie and Miller patents, both assigned to the present assignee, teach that the braze or fillet volume and the fillet morphology can affect the strength of the braze joint. The Miller patent seeks to reduce the volume of the fillet material to avoid the "tendency to creep upwardly reducing the strength of the joint . . . " (Column 1, lines 63-68). The Ainslie patent teaches a process which " . . . prevents the pin climb of metal up the shank of a pin . . . " (Column 5, lines 35-36). Similarly, the fillet amount and fillet morphology is discussed in IEEE article by Sahara, et al entitled "Improvement of Metallization for Alumina Substrates", Electronic Components Conference Proceedings, May 1982, pages 32-35, wherein it is taught that the recommended volume of bonding material is the minimum volume necessary to achieve the bond. As further illustrated in that article, at page 34 in FIG. 8, the stress profile for the reduced fillet volume sample (at [1]) is far more favorable than the stress profile for the higher fillet volume sample (at [2]). Still another reference, U.S. patent application Ser. No. 626,185, entitled "Process for Bonding Current Carrying Elements To a Substrate in an Electronic System, and Structures Thereof", which has now issued as U.S. Pat. No. 4,634,041, teaches the use of a pin head having a diameter which is significantly smaller than the diameter of the bonding pad in order to decrease the volume of the braze alloy and therefore decrease the likelihood of migration of the braze alloy. All indications from these sources are that the ideal pin joint has a low volume of the braze deposited between the pin head and the bonding pad and not extending in any direction beyond the periphery of the pin head itself. During the re-work procedures, however, the braze materials will migrate, the braze volume will be redistributed and the braze/fillet morphology will shift thereby increasing the stresses.

It is therefore an objective of the present invention to provide a method for bonding connectors to substrates whereby the stresses created in the ceramic are greatly reduced.

It is a further objective of the invention to provide a connector which provides minimum stress to the bonding pad and the underlying ceramic.

It is another objective of the invention to minimize the braze thickness gradient thereby more evenly distributing the stresses across the entire ceramic contact surface.

It is still another objective of the invention to provide a connector geometry which will prevent the redistribution and migration of the bonding material during further processing steps.

It is a further objective of the invention to provide a connection system which will increase the peeling and bending resistance of the pin joint.

These and other objectives will be met by the present invention wherein a connector is taught which has a shank portion, a flat head for connection, and a tapered portion extending from the flat head to the shank.

SUMMARY OF THE INVENTION

The reference number used from the drawings in this section are merely for illustration and should not be construed as a limitation of the invention.

The invention is directed to an interconnection system for a substrate 11, comprising; at least one electrically conductive pin brazed to the substrate 11, the pin having a head 23, 33, 34 or 35, and a shank 3, the shank 3, having a first diameter, the head having a flat bonding surface 5, with a second diameter, the second diameter is uniformly increasing than the first diameter, and an acute angle is made between the bonding surface 5, and the first diameter.

The invention is also for a connector to be brazed to a substrate 11, for electrically connecting that substrate to another electrical entity comprising; a flat bonding surface 5, having a first diameter; a shank 3, for interconnection, having a second diameter which is less than the first diameter; and, a tapered portion 23, 33, 34 or 35, extending from the shank 3, to the bonding surface 5, at an acute angle to the bonding surface.

The invention is directed to a connector wherein the tapered portion is beveled and wherein the angle defined by the beveled portion to the bonding surface is less than 90°.

The invention is for a connector, wherein the tapered portion is beveled at an angle of 45°.

The invention is for a connector wherein the tapered portion 33, is concave.

The invention discloses a connector wherein the tapered portion 34, is convex.

The invention is directed to a connector wherein the ratio of the diameter of the bonding surface 5, to the diameter of the shank 3, is greater than 2.4:1.

The invention is for a connector assembly brazed to a substrate 11, for electrically connecting the substrate 11, to another electrical entity comprising: at least one bonding pad 12, disposed on the surface of the substrate 11; at least one connector comprising a flat bonding surface 5, having a first diameter; a shank portion 3, having a second diameter which is less than the first diameter; and a section connecting the shank 3, to the bonding surface 5, the section having edges which taper from the bonding surface 5, to the shank 3; and braze material 24, between the bonding pad 12, and the flat bonding surface 5, and extending along the tapered edges.

The invention is directed to a connector wherein the tapered edges are beveled wherein the angle between the bonding surface of the connector and the beveled edges is less than 90°.

The invention is for a connector wherein the tapered edges are beveled such that the angle between the bonding surface of the connector and the beveled edges is 45°.

The invention is directed to an electrical component for attachment to an assembly member comprising; a head 23, 33, 34 or 35, brazed on a predetermined surface region of the assembly member, the head 23, 33, 34 or 35, having tapered edges so as to reduce the stresses applied on the assembly member; and a shank 3, extending from the head 23, 33, 34 or 35, wherein the edges having a decreasing taper from the surface 5, to the shank 3.

The invention discloses a component wherein the tapered edges are linear and the angle formed by the surface region and the tapered edges is less than 90°.

The invention is directed to a component wherein the tapered edges are linear and the angle formed by the surface region at which the head is attached and the beveled edges is 45°.

The invention discloses a component wherein the diameter of the shank 3, is substantially smaller than the diameter of the head 23, 33, 34 or 35.

The invention is directed to a component wherein the ratio of the diameter of the head 23, 33, 34 or 35, to the diameter of the shank 3, is greater than 2.4:1.

The invention is directed to an invention where in a semiconductor integrated circuit packaging assembly having at least one interconnect pin having shank 3, and pin head brazed on metallic pad located on a dielectric substrate, the improvement comprising; tapered edges on the pin head 23, 33, 34 or 35, extending at acute angles from the pad 12, to the shank 3, and adapted to reduce the stresses applied on the adjoining substrate 11, and wherein the braze material 24, is additionally disposed on the tapered edges.

The invention is in a semiconductor integrated circuit packaging assembly having at least one interconnect pin having a pin head 23, 33, 34 or 35, brazed to metallic bonding pad located on a dielectric substrate, the improvement comprising; the use of pin having head 23, 33, 34 or 35, with beveled edges extending at acute angles from the bonding pad 12, adapted to reduce the total volume of braze 24, in the bond wherein the braze 24, is deposited not only between the head 23, 33, 34 or 35, and the bonding pad 12, but also along the beveled edges.

BRIEF DESCRIPTION OF THE DRAWINGS

FIG. 1 illustrates a connector having a flat head of the type found in the art today.

FIG. 2 depicts the prior art connector brazed to a bonding pad on a ceramic substrate.

FIGS. 3A, 3B, 3C and 3D, illustrate connectors designed in accordance with the teachings of the present invention.

FIGS. 7A and 7B illustrate the braze morphology and the amount of pad material reacted with the braze during brazing and reflow processes using the prior art pin geometry.

FIGS. 8A and 8B illustrate the braze morphology and the amount of pad material reacted with the braze during brazing and reflow processes using the present inventive pin geometry.

DETAILED DESCRIPTION OF THE PREFERRED EMBODIMENT

Figure 5A:
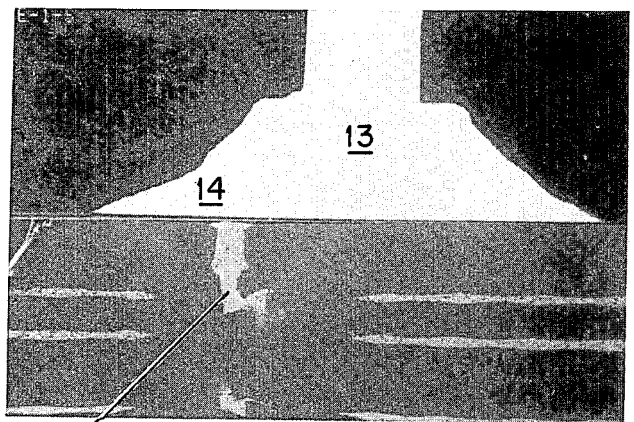
FIGS. 5A and 5B are cross-sectional views of the joints formed between the ceramic substrates and connectors from the prior art and in accordance with the present invention, respectively.
Figure 5B:
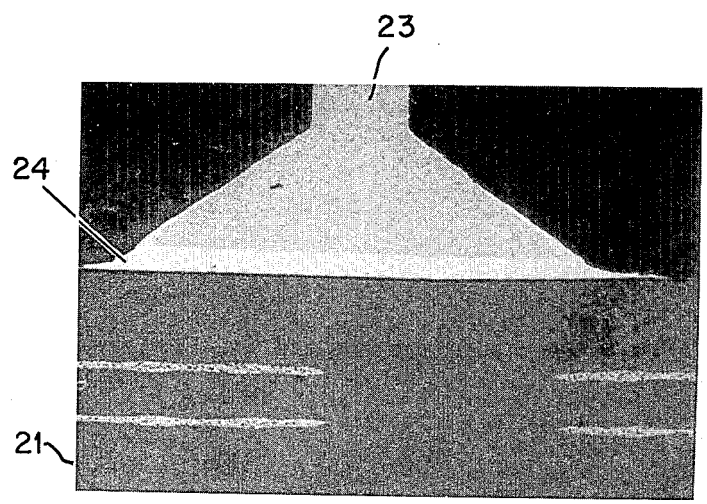
Figure 6A:
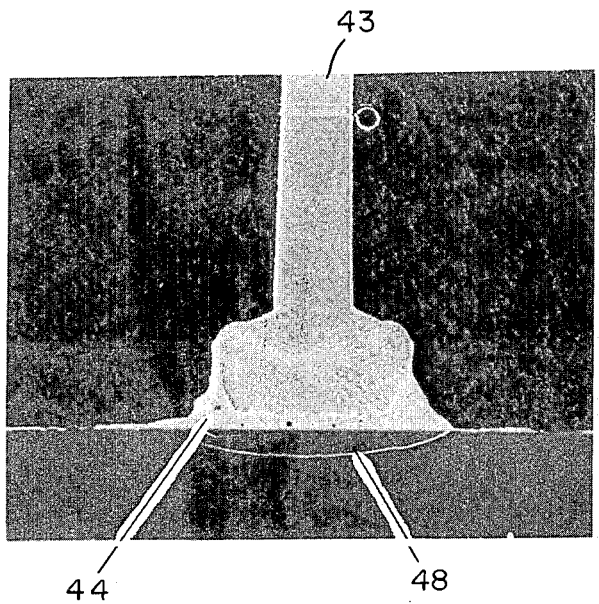
FIGS. 6A and 6B are cross-sectional views of the joints between the ceramic substrates and the connectors from the prior art and in accordance with the present invention after several re-flow steps, respectively.
Figure 6B:
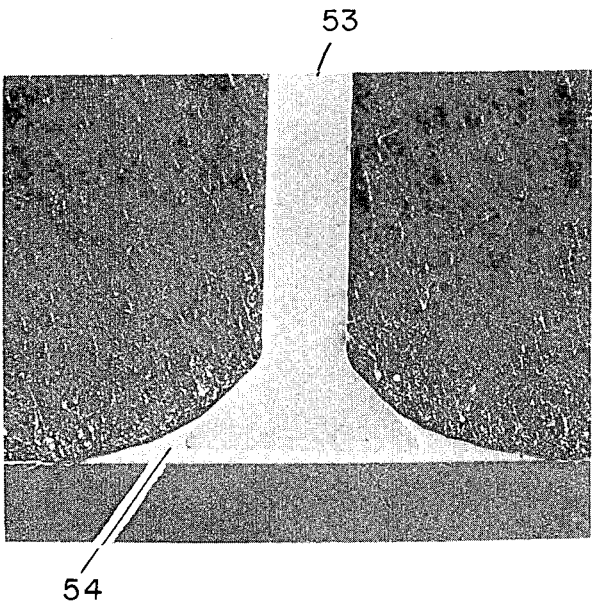

The use of high bond strength materials to attach connectors is common in the electronic components industry. Braze alloys, or other bonding media and the metallurgy associated with the bonding pads can generate stresses in the substrate which exceed the fracture strength of the ceramic leading to failures in the ceramic itself. Analysis of the braze process and the resulting joint have led to modifications designed to reduce the stress. The stress on the ceramic, or other substrate, is the result of a combination of forces. Stress is created at the interface of the multilayer ceramic and the bonding pad due to the thermal expansion mismatch. The brittle substrate is subjected to considerable stress in the vicinity of the pad edges due to this TCE mismatch. Further stress is created in the brazed joint itself due to the thermal expansion mismatch between the pad and the braze. The bonding pad is generally comprised of several layers of different metallurgy selected to provide both adhesion to the substrate and a wettable surface for the braze or solder bonding material. Therefore, stresses are generated within the pad itself due to thermal mismatches. Although efforts are made to match the TCE's of the adjoining materials, additional factors contribute to the braze:pad stress which cannot be as readily addressed. Those additional stress-producing mechanisms include the tendency of the braze to react with the pad and form inter-metallic compounds which increase the stress within the pad; and, the reactivity of the braze with other materials encountered during the remaining MLC processing steps, rendering the braze more brittle and, again, creating more stress. The tensile stress imparted by the braze joint to the pad is directed through the pad to the underlying MLC substrate. Therefore, the ceramic substrate must withstand the sum of the stresses. The total tensile stress is further concentrated on the ceramic areas located beneath the pad at the periphery of the pin head due to a tendency of the braze to wet and collect at the pin head and pad edges. This effect produces a thickness gradient whereby the thick fillet located at the pin head periphery produces a stress concentration on the ceramic which can result in cracks in the substrate, as illustrated in FIG. 5A at 18, and eventual non-repairable fracture of the ceramic.

The present invention, as illustrated in FIGS. 3A, 3B, 3C and 3D, is a pin which is tapered from the shank 3, to the flat surface 5, at which connection is made to the bonding surface. This unique design minimizes the stresses imparted to the ceramic by reducing the volume of the bonding material, such as braze, which would ordinarily collect at the pin head periphery. The thickness gradient is minimized, by allowing for a "distribution" of the stresses along the entire contact surface of the ceramic. A further advantage of the tapered head pin geometry is that the fillet morphology will remain unchanged after numerous re-flows. In addition to the reduction in the overall volume of the fillet or braze with the tapered head pin, a reduction in the reaction rate with the pad metallurgy and migration rate of the braze will be achieved. Mechanically, the advantage of tapering of the pin head results in the lowering of the load force on the pins, pad and ceramic substrate; said force being applied by the bending or peeling stresses associated with handling and insertion of the finished package. The lowering of the load force can reduce the bending moment at the pin head periphery and pad edges and, as a consequence, increase the peel and bending resistance of the braze joint.

As illustrated in FIGS. 3A–D, the angle of taper is not critical nor is the exact geometry of the head, as long as the taper from the bonding surface to the shank is uniformly decreasing in dimensions. Different head shapes are illustrated, for example, straight edge taper 23, concave taper 33, convex taper 34, and beveled edge taper 35. What is necessary is some degree of tapering away from the vertical in order to distribute the stresses. As noted above, the total stress on the pad/substrate is the result of a combination of forces. The tensile stress t is a result of both a vertical component v and a horizontal component h. Theoretically, when fabricating a symmetrical pin whereby the shank 3, diameter is one-third of the diameter of the bonding surface 5, the combined stress will be the least if a 45 degree angle of taper is used. The "splitting" of the stress components, i.e., v=h, with neither stress component having a high peak stress, will result in minimizing the total stress, t. The relative dimensions of the pin shank 3, diameter and the pin head diameter are not limited by the geometry of the tapered head, whereas the dimensions are limited when a standard pin head is fabricated using the cold-heading process. The cold-heading process is well known in the art as a method for fabricating connectors such as pins and nails. For the molded or cold-headed process, the geometry of the flat-edge headed pin 13, which is known in the art, and shown in FIG. 1, dictates that the ratio of the diameter of the head to the diameter of the shank be approximately 2.4:1. The taper-headed pin by its design uses a lower volume of pin material, therefore with the tapered head pin, a higher pin head diameter to shank diameter ratio can be achieved; for example, a 3.7:1 ratio has been achieved in the cold-heading fabrication of a beveled-head pin. From a cold-heading fabrication standpoint, the tapered head pin is not only desirable in use, but it is also desirable for economic and throughput considerations.

FIGS. 2 through 8B illustrate the advantages gained by the use of the proposed tapered head pin in stress relief. FIG. 2 and 7A, depicts a standard flat head pin, 13, mounted by fillet, 14, to the bonding pad, 12, on a substrate, 11. The fillet 14, as illustrated therein, collects at the pin head periphery, 15, and consequently increases the stress on the ceramic directly beneath the high volume of fillet. The illustration labeled FIG. 5A reveals a crack, 18, in the underlying ceramic at the point at which the stress is increased by the concentration of fillet. Not only is the tensile stress increased by the volume of fillet 14; but, also, the pad material is reacted more completely by the greater amount of braze material. As illustrated in FIG. 7B at 45, the bonding pad 12, material in the vicinity of the pin head periphery 15, and therefore in the vicinity of the highest concentration of braze 14, volume, has been reacted and depleted to the extent that delamination from the substrate 11, may occur. Reaction with the wettable surface of the pad 12, can be desirable; however, the higher volume of braze 14, also tends to react with the underlying pad 12, material. The more braze 14, that is reacted with the underlying bonding pad 12, material in that localized area, the more brittle the braze alloy may become thereby creating greater stress on the substrate 11. FIG. 6A also illustrates the standard flat head pin, 43, and associated fillet morphology, 44, after several re-flows. The fillet, or braze 44, has redistributed and reacted with the pad creating associated stresses which have generated severe cracks, 48, in the underlying ceramic. The geometry of the tapered head pin 23, however, illustrated in FIG. 8A at 23 having a beveled edge, minimizes the fillet volume at the pin head periphery 15. A uniform distribution of braze, 24, is achieved, along with a uniform stress distribution. As can be noted in FIG. 5B, having a pin head 23, on an underlying ceramic 21, and again after several reflows in FIG. 6B, no cracks are generated in the underlying ceramic when the tapered head pin is used. Furthermore, there is little change in the fillet morphology, after re-flow processes have been carried out, as can be seen in FIG. 6B at 54, for the pin 53. Additionally, as illustrated in FIG. 8B, less of the pad 22, material 46, is reacted by the braze since a lower volume of braze is needed when using the taper-headed pin. In the instance of the taper-headed pin, all of the braze material is reacted with a small amount of the wettable surface of the bonding pad material to create a braze alloy having a higher concentration of the wettable material, for example Au (from the gold plating on both the pins and the pad). As such, the resulting Au-enriched braze alloy has a higher melting temperature. Subsequent re-flow steps will not melt the Au-enriched braze as readily as the unreacted braze of the past and therefore the braze will not redistribute to create greater stresses.

Figure 4:
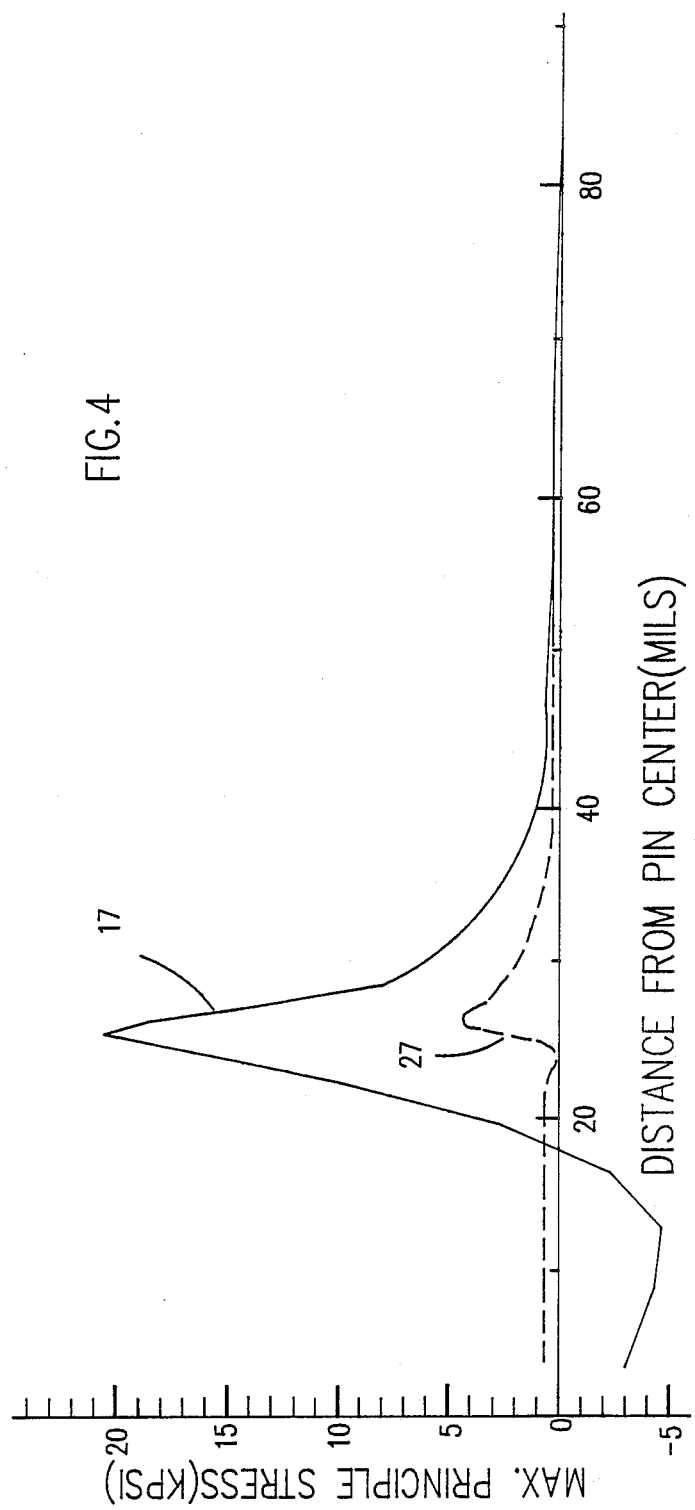
FIG. 4 illustrates the braze stresses across the pin joint using the prior art flat-edged pin and the tapered-head pin of the present invention.

The combination of advantageous features of the tapered head design result in vastly reduced stress across the bonding surface as illustrated in FIG. 4. The graphic illustration indicates that at least a 50 percent decrease in stress results from the use of the new pin geometry. The stress across the bonding surface for a flat-edged pin head is shown by the graph 17, and that for a beveled-head pin is shown by the graph 27, in FIG. 4. The sample pins used were fabricated from the same materials (in the tests as illustrated, Invar was used as a pin material for both samples) to eliminate any variables. However, in subsequent testing wherein both flat-edged and beveled-head pins were fabricated of several different materials, having different thermal co-efficients of expansion, it was discovered that the beveled-head pin geometry reduced stress to the same degree regardless of the materials used. Specifically, an Invar beveled pin and a Kovar beveled pin were tested on a substrate. It was found that although the TCE's of the respective samples differ greatly, there was little difference in the stresses created by the Kovar and the Invar beveled pins on the substrate. Such results indicate that the tensile stresses which are relieved by the beveling geometry are far greater than the thermal stresses created by TCE mismatch.

The invention has been described with reference to several working embodiments utilizing materials known to be used in the art today. The invention is not intended to be limited to the materials or the specific applications discussed. Other pin materials, variations of tapering geometry, and different substrate and bonding materials are contemplated and would fall within the spirit and scope of the claimed invention.

What is claimed is:

1. An interconnection system for a substrate comprising;
   at least one electrically conductive pin brazed to said substrate, said pin having a head and a shank, said shank having a first diameter, said head having a bonding surface with a second diameter, said second diameter is uniformly increasing than said first diameter, and an acute angle is made between said bonding surface and said first diameter, and wherein the stress across said bonding surface is minimized by at least reducing said braze volume at said pin head periphery.

2. A connector to be brazed to a substrate for electrically connecting that substrate to another electrical entity comprising;
   a bonding surface having a first diameter;
   a shank for interconnection, having a second diameter which is less than said first diameter; and
   a tapered portion extending from the shank to the bonding surface at an acute angle to said bonding surface, and wherein the stress across said bonding surface is minimized by at least reducing said braze volume at the periphery of said first diameter of said connector.

3. The connector of claim 2, wherein the tapered portion is beveled wherein the angle defined by said beveled portion to the bonding surface is less than 90°.

4. The connector of claim 2, wherein the tapered portion is beveled at an angle of 45°.

5. The connector of claim 2, wherein the tapered portion is concave.

6. The connector of claim 2, wherein the tapered portion is convex.

7. The connector of claim 2, wherein the ratio of the diameter of the bonding surface to the diameter of the shank is greater than 2.4:1.

8. A connector assembly brazed to a substrate for electrically connecting said substrate to another electrical entity comprising:
   at least one bonding pad disposed on the surface of said substrate;
   at least one connector comprising a flat bonding surface having a first diameter; a shank portion having a second diameter which is less than said first diameter; and a section connecting said shank to said bonding surface, said section having edges which taper from said bonding surface to said shank; and
   braze material between said bonding pad and said flat bonding surface and extending along said tapered edges.

9. A connector as in claim 8, wherein said tapered edges are beveled wherein the angle between the bonding surface of said connector and the beveled edges is less than 90°.

10. A connector as in claim 8, wherein the tapered edges are beveled such that the angle between the bonding surface of said connector and the beveled edges is 45°.

11. A connector as in claim 8, wherein the tapered edges are concave.

12. A connector as in claim 8, wherein the tapered edges are convex.

13. A connector as in claim 8, wherein the ratio of the diameter of the bonding surface to the diameter of the shank is greater than 2.4:1.

14. An electrical component for attachment to an assembly member comprising:
   a head brazed on a predetermined surface region of said assembly member, said head having tapered edges so as to reduce the stresses applied on said assembly member; and a shank extending from said head;
   wherein said edges are tapered from said surface to said shank, and wherein the stress across the bonding surface is minimized by at least reducing said braze volume at the periphery of said head.

15. A component as claimed in claim 14, wherein the surface region and the tapered edges is less than 90°.

16. A component as claimed in claim 14, wherein the tapered edges are linear and the angle formed by the surface region at which the head is attached and the beveled edges is 45°.

17. The component of claim 14, wherein the diameter of the shank is substantially smaller than the diameter of the head.

18. The component of claim 14, wherein the ratio of the diameter of the head to the diameter of the shank is greater than 2.4:1.

19. In a semiconductor integrated circuit packaging assembly having at least one interconnect pin having shank and pin head brazed on metallic pad located on a dielectric substrate, the improvement comprising;

tapered edges on said pin head extending at acute angles from said pad to said shank and adapted to reduce the stresses applied on said adjoining substrate and wherein said braze material is additionally disposed on said tapered edges.

20. In a semiconductor integrated circuit packaging assembly having at least one interconnect pin having a pin head brazed to metallic bonding pad located on a dielectric substrate, the improvement comprising;

the use of pin having head with beveled edges extending at acute angles from said bonding pad adapted to reduce the total volume of braze in the bond wherein said braze is deposited not only between said head and said bonding pad but also along said beveled edges.

* * * * *